United States Patent

Tai et al.

[11] Patent Number: 6,146,543
[45] Date of Patent: Nov. 14, 2000

[54] MICROBELLOWS ACTUATOR

[75] Inventors: Yu-Chong Tai; Xing Yang, both of Pasedana, Calif.

[73] Assignee: California Institute of Technology, Pasadena, Calif.

[21] Appl. No.: 09/427,513

[22] Filed: Oct. 26, 1999

Related U.S. Application Data

[62] Division of application No. 09/057,381, Apr. 8, 1998, Pat. No. 6,069,392.
[60] Provisional application No. 60/077,945, Mar. 13, 1998, and provisional application No. 60/043,463, Apr. 11, 1997.

[51] Int. Cl.[7] .................... B81B 3/00; B82B 3/00
[52] U.S. Cl. .................... 216/2; 216/95; 216/99
[58] Field of Search .................... 216/2, 56, 95, 216/99; 438/50, 53; 257/415, 418, 419; 73/724

[56] References Cited

U.S. PATENT DOCUMENTS

| | | | |
|---|---|---|---|
| 4,399,424 | 8/1983 | Rigby | 338/34 |
| 4,740,410 | 4/1988 | Muller et al. | 216/2 |
| 4,897,360 | 1/1990 | Guckel et al. | 216/2 |
| 4,966,646 | 10/1990 | Zdeblick | 216/2 |
| 5,068,203 | 11/1991 | Logsdon et al. | 216/2 |
| 5,177,579 | 1/1993 | Jerman | 73/724 |
| 5,178,015 | 1/1993 | Loeppert et al. | 73/718 |
| 5,348,617 | 9/1994 | Braymen | 216/2 |
| 5,622,633 | 4/1997 | Ohtsuka et al. | 438/53 |
| 5,627,396 | 5/1997 | James et al. | 257/415 |
| 5,725,729 | 3/1998 | Greiff | 216/2 |
| 5,804,462 | 9/1998 | Liu et al. | 438/53 |

FOREIGN PATENT DOCUMENTS 5-90616  4/1993  Japan.

OTHER PUBLICATIONS

Barron, C.C. et al "Sample (Sandia Agile MEMS Prototyping, Layout tools, and Education)" Proceedings of SPIE, Micromachining and Microfabrication Process Technology III, vol. 3223, pp. 10–15, Sep. 1997.

*Primary Examiner*—Randy Gulakowski
*Assistant Examiner*—Anita Alanko
*Attorney, Agent, or Firm*—Fish & Richardson P.C.

[57] ABSTRACT

A micromachined multi-layered microbellows-style actuator capable of delivering larger deflections compared to a single layered flat membrane of comparable size. Anchor structures are disclosed that improve the strength of the microbellows membrane. A characterization apparatus is used to measure microbellows membrane performance. Thermopneumatic actuators having a resistive heater chip are also disclosed. The microbellows membrane is manufactured by alternating deposition of structural layers and sacrificial layers on a substrate. The structural layers can be made of silicon nitride and the sacrificial layers can be made of polysilicon. The substrate is etched from the back to form an opening exposing the sacrificial layers, and then the membrane is released by etching away the sacrificial layers.

35 Claims, 8 Drawing Sheets

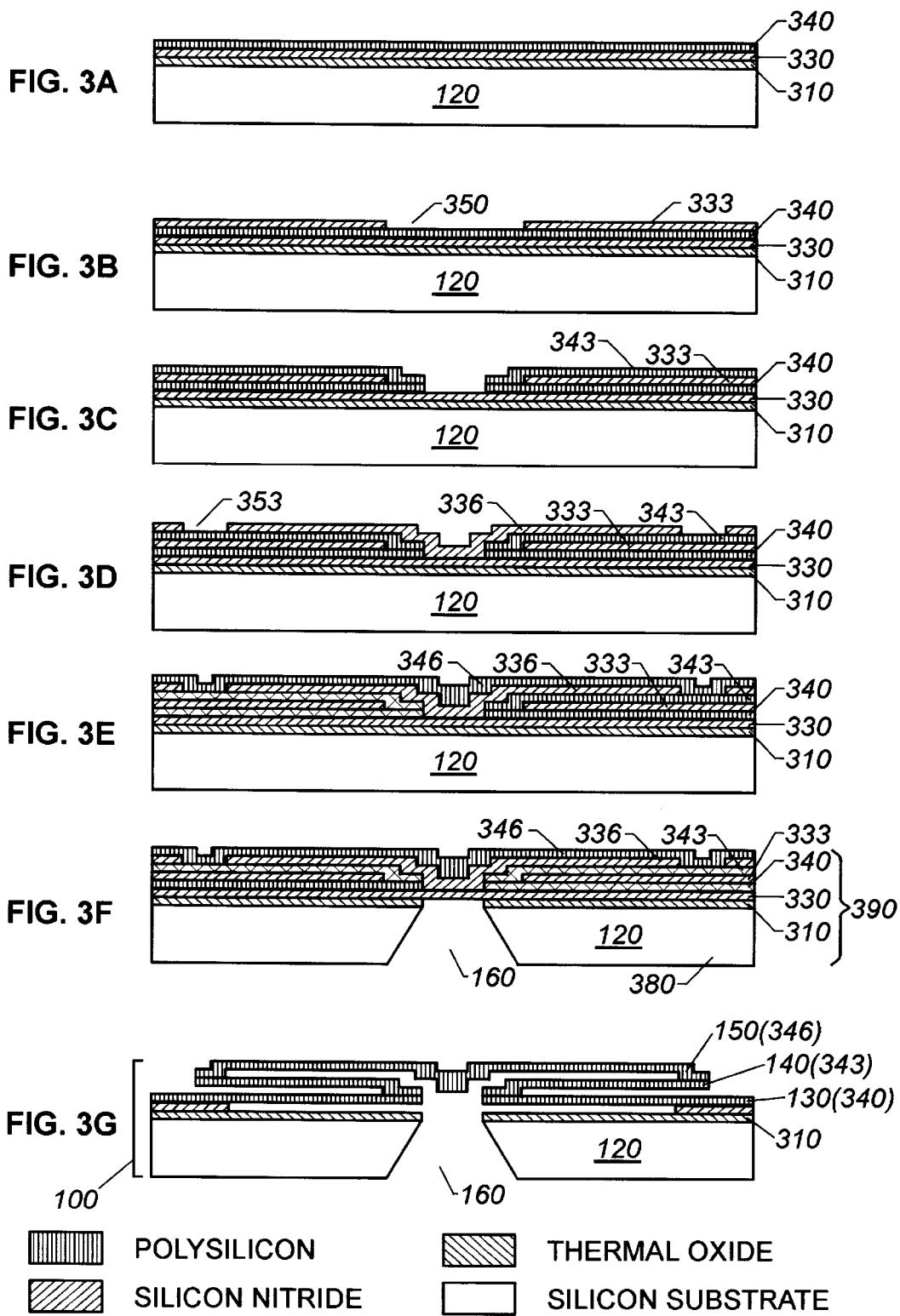

| DIAMETER (μm) | 400 | 600 | 800 |
|---|---|---|---|
| SINGLE FLAT MEMBRANE | 150 PSI | 75 PSI | 57 PSI |
| BELLOW WITH STEP-UP ANCHORS | 23 PSI | 14 PSI | 12 PSI |
| BELLOW WITH STRENGTHENED ANCHORS | 130 PSI | 72 PSI | 53 PSI |

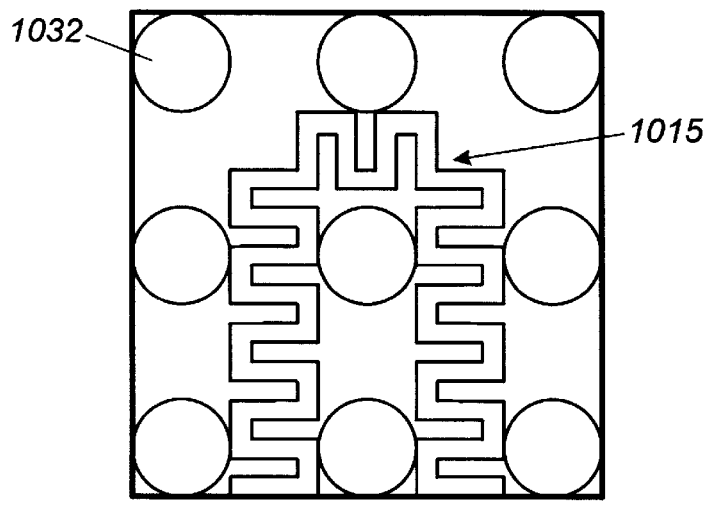
FIG. 10B
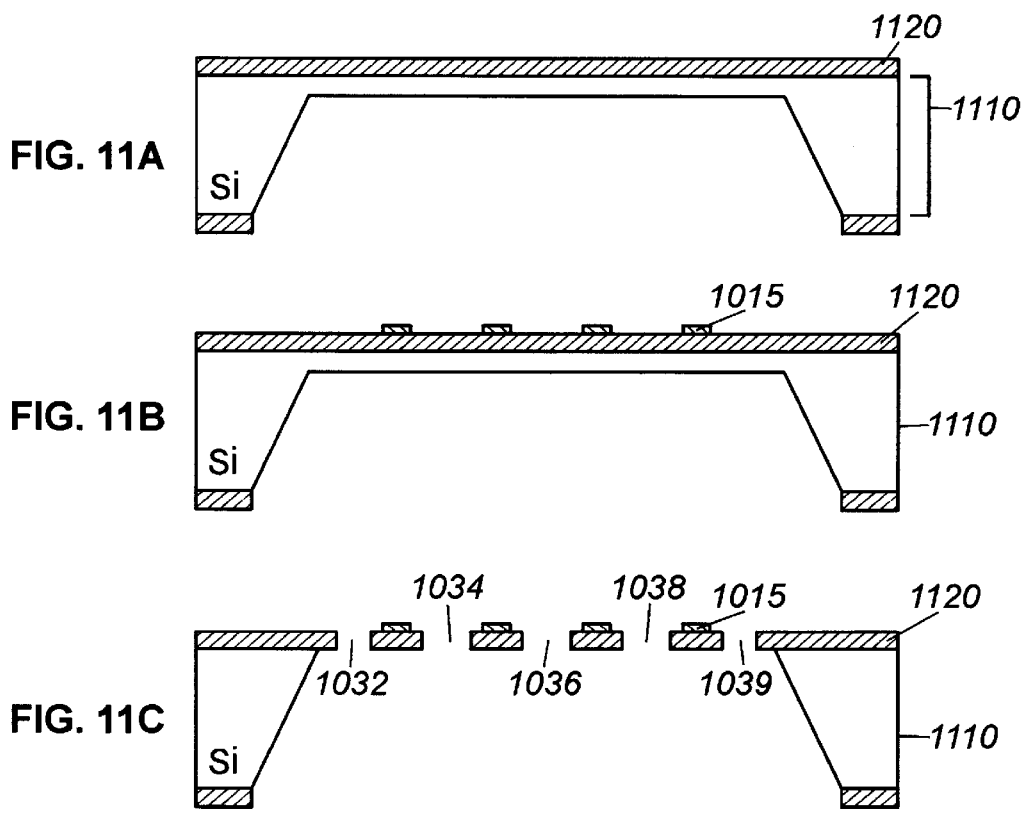
FIG. 11A
FIG. 11B
FIG. 11C

MICROBELLOWS ACTUATOR

U.S. Government may have certain rights in this invention pursuant to Grant No. N66001-96-C-8632 awarded by the U.S. Navy.

This is a divisional of U.S. application Ser. No. 09/057,381, filed Apr. 8, 1998, now U.S. Pat. No. 6,069,392, and claims benefit to U.S. Provisional application Ser. No. 60/077,945, filed Mar. 13, 1998, and U.S. Provisional application Ser. No. 60/043,463, filed Apr. 11, 1997.

FIELD

This disclosure relates to the fabrication of a micromachined bellows-style actuator.

BACKGROUND

Flat single layer membranes have been used as actuator structures in micro-electro-mechanical systems ("MEMS"). Some MEMS devices that incorporate actuator structures include microvalves, which are turned on or off by the actuator and micropumps that are actuated to pump by the actuator.

Previously, flat single layer silicon membranes have been used in actuator structures. However, silicon has a relatively high Young's modulus, e.g. 139 to 190 GPa, which can limit the actuator's deflection capability. Typically, to achieve about a 50 $\mu$m deflection, a 5 mm×5 mm×50 $\mu$m single layer silicon membrane is usually needed.

For MEMS applications, smaller membranes that occupy less chip real estate is desired. However, flat single layer membranes with smaller dimensions achieve smaller deflections. Larger deflections are desirable for facilitating high flow applications in some microvalve implementations. In high flow microvalves, a large distance between the valve seat and the rest position of the actuator membrane is desired. This large distance allows a large amount of flow to pass through when the microvalve is opened. Hence, to close the microvalve, a large deflection distance is required from the actuator membrane. Thus, in some MEMS applications, both large deflections and small size are desired.

There are different approaches to fabricating a MEMS applicable actuator membrane capable of achieving large deflections. One approach is to make a thinner membrane. Thinner membranes may provide increased deflections because the thinner membrane can stretch more during actuation. However, thinner membranes may have a lower pressure tolerance before the membrane loses structural integrity and bursts.

Another approach is to use flexible materials for the membrane. Low Young's modulus materials with high elongation, good compatibility with IC processes, and good sealing properties on rough surfaces are generally desired. One such material is silicone rubber, which has a Young's modulus of approximately 1 MPa, as described in U.S. patent application Ser. No. 60/036,253, filed Jan. 24, 1997 the disclosure of which is incorporated by reference.

Yet, another approach is to modify the structure of the MEMS actuator membrane in order to maximize deflection while minimizing size.

SUMMARY

The inventors disclose a novel structure for MEMS applicable actuator membranes. This novel structure is a micromachined multi-layer bellows-style membrane. Multiple membrane layers are stacked on top of each other. Each layer is joined at discrete points to its adjacent layer creating a folded membrane structure capable of expanding and deflating a certain vertical distance. When actuated, every layer in this multi-layer membrane structure moves upward thereby achieving larger deflections than a flat single layer membrane occupying comparable area.

Large deflection distances has been demonstrated in the microbellows membrane. In one embodiment, an 800 $\mu$m in diameter circular microbellows membrane having three 1.2 $\mu$m thick silicon nitride layers can deflect more than 50 $\mu$m in the center. Comparatively, a flat single layer membrane with the same dimensions can usually deflect only 13 $\mu$m.

In one embodiment, a three-layer silicon nitride microbellows membrane is fabricated by using polysilicon/TMAH sacrificial layer etching technology. Inside the bellows, rims of sacrificial layer are fabricated at the joints between every two layers to form strengthened anchors. This extra re-enforcement sacrificial layer can improve boundary conditions by reducing the stress concentration on the joints. Approximately five times improvement in burst pressure has been achieved over microbellows membranes without these strengthened anchors.

Other materials may be used to fabricate the microbellows membrane.

Thermopneumatic actuation of the microbellows membrane is also described. The volume of the heater/membrane assembly changes significantly during operation. Hence, a gas/liquid system for thermopneumatic actuation is used. A thermopneumatic actuation device having a suspended resistive heater chip is described.

BRIEF DESCRIPTION OF THE DRAWINGS

These and other aspects will be described with reference to the drawings, in which:

FIGS. 3A–3G show major fabrication steps of a microbellows actuator;

FIG. 10B shows a top view of a suspended resistive heater chip; and

FIGS. 11A–11C show major fabrication steps for a suspended resistive heater chip.

DESCRIPTION OF THE PREFERRED EMBODIMENTS

General Structure

Figure 1:
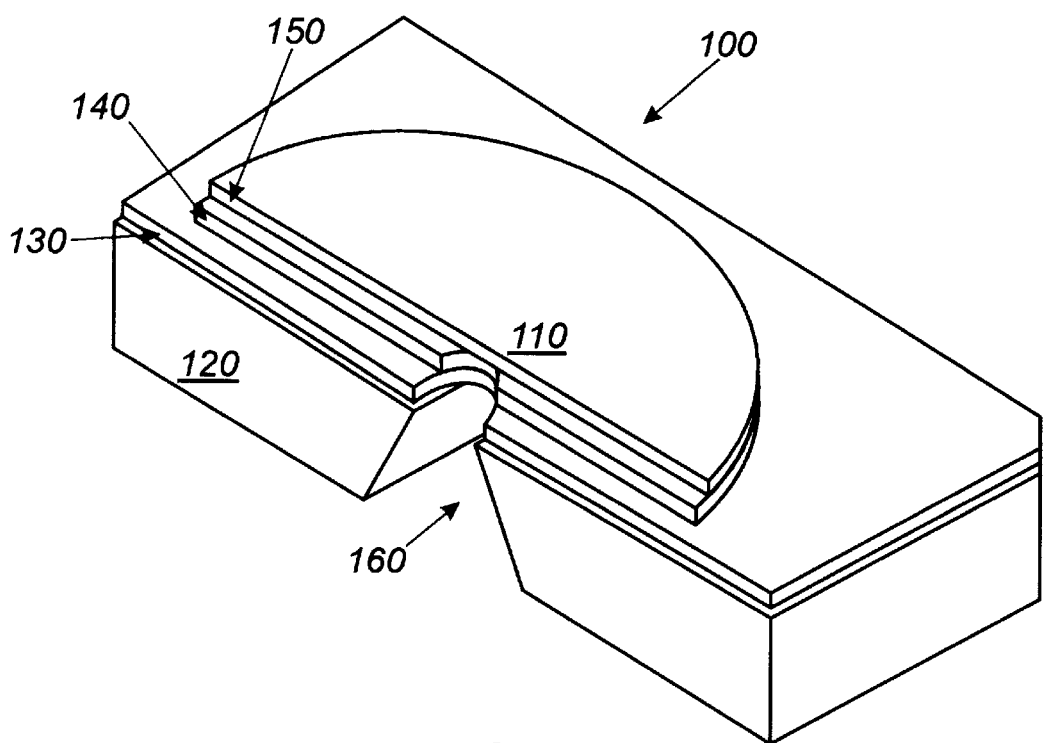
FIG. 1 is a three dimensional cross-sectional view of a microbellows actuator.

FIG. 1 is a three-dimensional cross-sectional view of a microbellows actuator structure 100. The microbellows actuator 100 is a multi-layer bellows-style mechanical structure. Multiple membrane layers are stacked on top of each other in an offset manner that allows deflection like a bellows. Each layer having two ends is connected to another layer at alternating ends forming discrete joints thereby creating an offset, folded configuration. A space is left in between each layer to separate each layer and allow deflection of each layer. This space is coupled to the space in between the next adjacent layers; hence, the folded membrane structure has a central space for a force to enter during actuation. This multiple layered folded membrane structure is capable of expanding and deflating a certain vertical distance.

When the microbellows membrane 110 is actuated upward, every layer in the microbellows membrane 110 moves upward. Hence, the total defection of the microbellows membrane 110 can be much larger than the deflection of a single flat membrane with comparable dimensions.

In a preferred embodiment as shown in FIG. 1, a three-layer microbellows membrane 110 is fabricated on a silicon substrate 120. The first layer 130, the second layer 140 and the third layer 150 of the microbellows membrane 110 are each preferably made from 1.2 $\mu$m thick LPCVD silicon nitride. Other low modulus materials such as silicone rubber can also be used. An opening 160 is etched by potassium hydroxide (KOH) on the back side of the silicon substrate 120.

During operation, a force can enter from the opening 160 thereby actuating the microbellows membrane 110. The force deflects the first layer 130, the second layer 140, and the third layer 150, making the multi-layer microbellows membrane 110 inflate up like a balloon.

Figure 2:
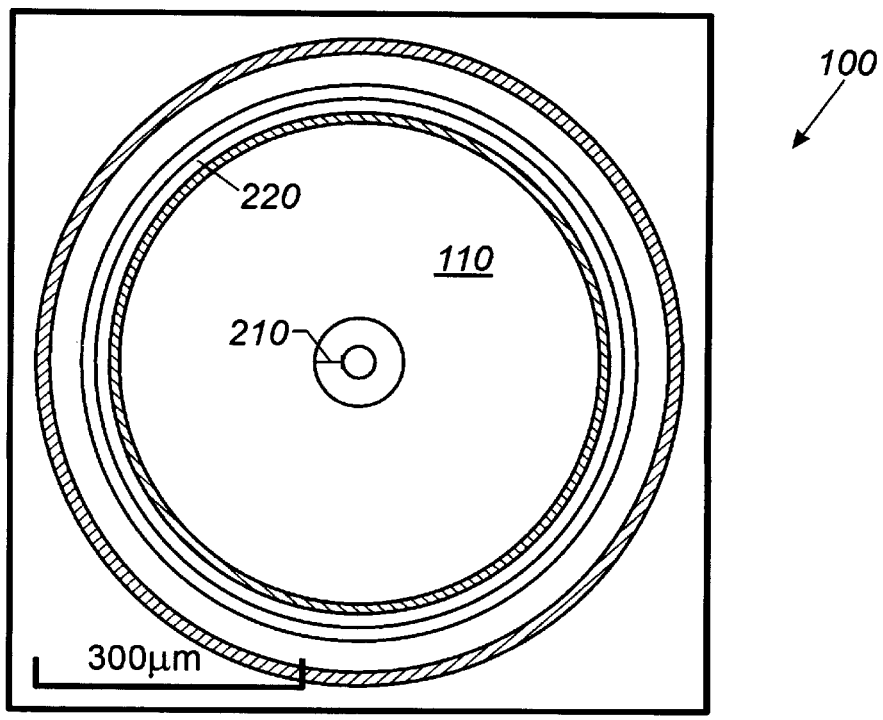
FIG. 2 shows a top view of a 600 $\mu$m in diameter three-layer microbellows actuator.

FIG. 2 shows the top view of a 600 $\mu$m in diameter three-layer microbellows actuator 100. The microbellows membrane 110 is deflected in FIG. 2. The first rim 210 is the joint between the first layer 130 and the second layer 140. The second rim 220 is the joint between the second layer 140 and the third layer 150.

Preferred Materials

Three-layer microbellows actuator with diameters of 400 $\mu$m, 600 $\mu$m and 800 $\mu$m have been fabricated by using surface micromachining technology. Other diameters can also be fabricated; diameters up to 2 mm have been fabricated.

High fracture strain materials are desirable structural materials for the microbellows membrane. High strain materials have a higher tolerance to repeated deflection. One preferred structural material is LPCVD low-stress silicon-rich silicon nitride. This material has a high fracture strain of approximately 3%. Low modulus materials are preferred. Another preferred structural material having low modulus is Parylene C. However, higher modulus materials such as polysilicon and metals can also be used.

Both phosphosilicate glass (PSG) and undoped polysilicon can be used as the sacrificial layer with high concentrations hydrofluoric acid and tetramethyl ammonium hydroxide (TMAH) as the corresponding etchants. The use of polysilicon as the sacrificial layer and TMAH as the etchant is preferred because TMAH shows extremely high polysilicon etching selectivity over silicon nitride, the preferred structural material in this embodiment.

Other sacrificial layer and etchant combinations which have a high selectivity over the chosen structural material can be used.

Other structural layer and sacrificial layer combinations can also be used. Some of these combinations include: polysilicon/silicon dioxide, silicon nitride/silicon dioxide, metal/photoresist. Parylene is a preferred structural material. Some sacrificial layers that may be used with Parylene include photoresist and polysilicon.

Fabrication Steps

FIGS. 3A–3G show major fabrication steps of the microbellows actuator 100.

FIG. 3A shows initially growing a support substrate protectant layer of 0.5 $\mu$m thick thermal oxide 310 on a support substrate 120, preferably a silicon substrate. A thermal oxide layer 310 is grown on the silicon substrate 120 to protect the silicon substrate 120 from later sacrificial TMAH etching. A first 1 $\mu$m thick LPCVD undoped polysilicon sacrificial layer 330 is deposited at above 600° C., preferably at around 624° C.

Then, a first 1.2 $\mu$m thick LPCVD silicon nitride structural layer 340 is deposited at around 835° C. The structural layer deposition is performed with a 4:1 dichlorosilane (DCS) :NH$_3$ flow ratio. This ratio is significant to minimize cracking of the silicon nitride layer by reducing tensile stress. The first silicon nitride structural layer 340 eventually forms the first layer 130 of the microbellows membrane 110.

FIG. 3B shows a second 1 $\mu$m thick LPCVD undoped polysilicon sacrificial layer 333 deposited on top of the first 1.2 $\mu$m thick LPCVD silicon nitride structural layer 340. The second polysilicon sacrificial layer 333 is patterned to open a contact window 350. This contact window 350 is to be a window between the first layer 130 and the second layer 140 of the fabricated microbellows membrane 110.

FIG. 3C shows a second 1.2 $\mu$m thick LPCVD silicon nitride structural layer 343 deposited and patterned to define the second layer 140 of the microbellows membrane 110.

This process is continued by alternately depositing and patterning a polysilicon sacrificial layer followed by a silicon nitride structural layer to form additional microbellows membrane layers.

FIGS. 3D–3E show the depositions for forming a third microbellows membrane layer 150. FIG. 3D shows a third 1 $\mu$m thick LPCVD undoped polysilicon sacrificial layer 336 deposited on top of the second silicon nitride structural layer 343. The third polysilicon sacrificial layer 336 is patterned to produce openings 353. FIG. 3E shows a third 1.2 $\mu$m thick LPCVD silicon nitride structural layer 346 deposited on top of the third polysilicon sacrificial layer 336. The third silicon nitride structural layer 346 forms the third layer 150 of the microbellows membrane 110.

After defining the microbellows membrane 110 by depositing the desired amount of layers, a window 160 is opened on the back side 380 of the silicon substrate 120. KOH is used to etch away a portion of the silicon substrate 120 and a portion of the thermal oxide layer 310 as shown in FIG. 3F.

Finally, the entire wafer 390 is immersed into a 15% TMAH solution at around 90° C. TMAH etches away the polysilicon sacrificial layers 330, 333, 336 to release the microbellows membrane 110 as shown in FIG. 3G.

Modified Anchor Structure

Figure 4A:
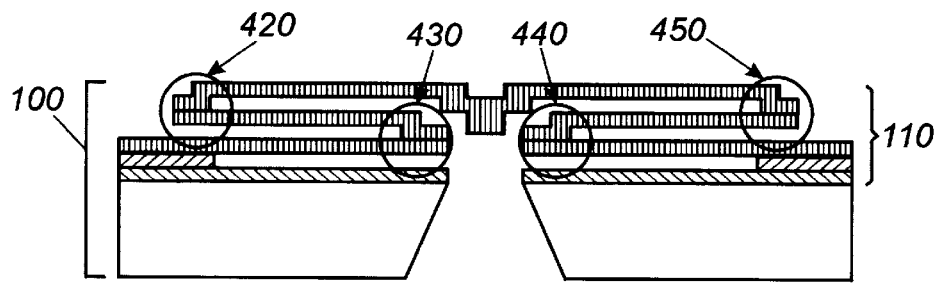
FIG. 4A shows a microbellows actuator with step-up anchors.

In one embodiment, the microbellows membrane 110 has step-up anchors 420, 430, 440, 450. These step-up anchors are at the places where the structural layers join each other as shown in FIG. 4A. When a pressure load is applied to the microbellows membrane 110 during actuation, these step-up anchors can become stress concentration points. The microbellows membrane 110 can be vulnerable to bursting at these stress points 420, 430, 440, 450.

Figure 4B:
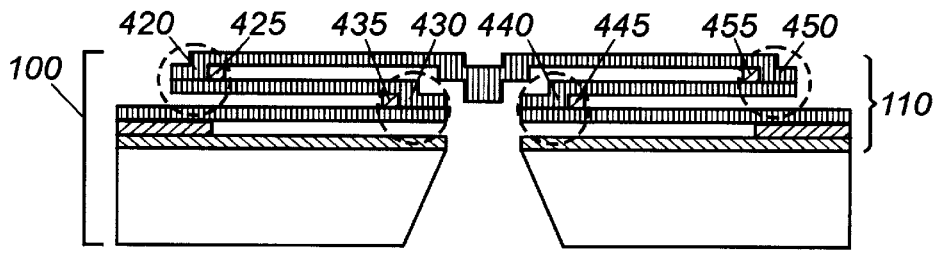
FIG. 4B shows a microbellows actuator with strengthened anchors.

These step-up boundary conditions can be improved by modifying the anchor structures as shown in FIG. 4B. The anchors 420, 430, 440, 450 can be strengthened by leaving blocks of sacrificial layer 425, 435, 445, 455 near the edges where the two structural layers are joined together.

Figure 4C:
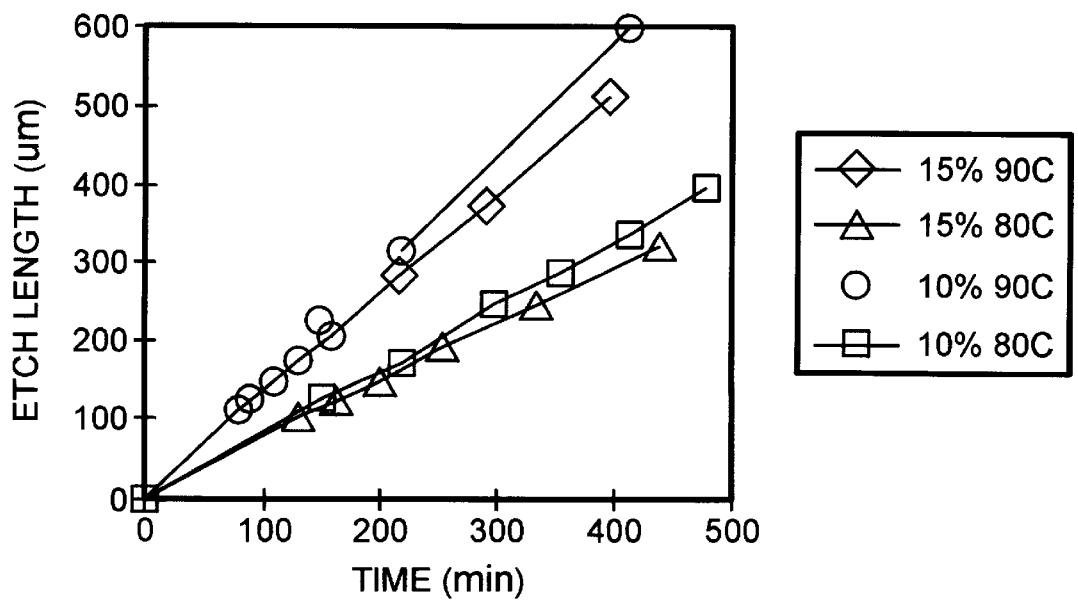
FIG. 4C shows a plot of etch length as a function of etch time in polysilicon sacrificial layer etching in TMAH.

In order to fabricate such a strengthened anchor structure, the inventors performed an in-situ study of polysilicon sacrificial layer etching in TMAH solution. A graph illustrating detailed plots of the etch length as a function of etch time is shown in FIG. 4C. The inventors found that although there is a constant generation of hydrogen bubbles during etching, the etching fronts can be maintained as circular if the etching windows are small and circular. The amount of sacrificial layer etched is easily controlled by monitoring the time these carefully maintained circular etching fronts are allowed to react with the sacrificial layer.

Using these etching parameters, the inventors can monitor and control the timing of the etching process so that an approximately 20 $\mu$m wide sacrificial layer rim/additional block is left at all joints. The size of this additional re-enforcement sacrificial rim can be varied. This re-enforcement rim forms the strengthened anchors. The rim should be sufficiently large to strengthen the joints but at the same time not be too large to as to hinder deflection capabilities of the microbellows membrane 110.

Another method to fabricate the strengthened anchors is to selectively dope the anchor part of the polysilicon sacrificial layer with boron. Heavily boron doped polysilicon shows a very low etch rate in TMAH. When the etching reaches the boron doped polysilicon portion, the TMAH will stop and leave the boron doped portion behind. This boron doped portion is an additional block portion positioned at the anchor joints thereby creating strengthened anchors. One workable concentration is depositing $4 \times 10^{20}$ boron atoms/cm$^3$ of polysilicon sacrificial layer. Higher concentrations of boron doping can also be used.

Burst Pressure Measurement

Figure 5:
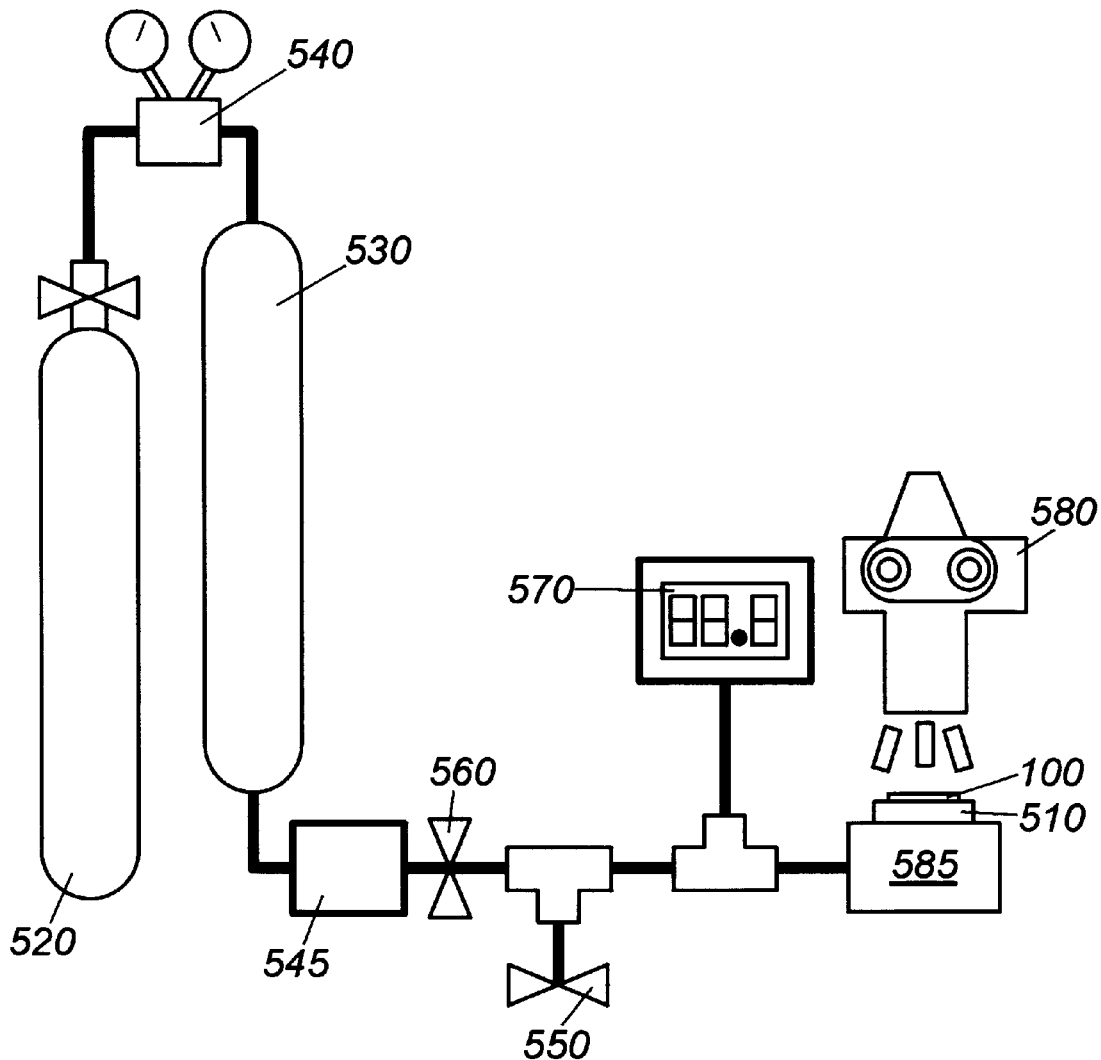
FIG. 5 shows a microbellows actuator performance characterization apparatus.

The burst pressure of the microbellows membrane can be tested under an apparatus as shown in FIG. 5. The microbellows actuator 100 is secured on a chip holder 510. A controlled pneumatic pressure is applied to the back window 160 of the microbellows actuator 100. The pressure at which the microbellows membrane 110 bursts is the burst pressure. High burst pressures signifies high microbellows structural strength.

The apparatus can have a gas cylinder 520 which feeds gas into a reservoir 530. A pressure regulator 540 is coupled to the gas cylinder 520 and reservoir 530. The reservoir 530 feeds gas through a particle filter 545. Release valve 550 and control valve 560 are opened/closed alternately to control the influx of pressure into the chip holder 510. Pressure gauge 570 measures the pressure applied onto the chip holder 510.

Figures 6, 7:
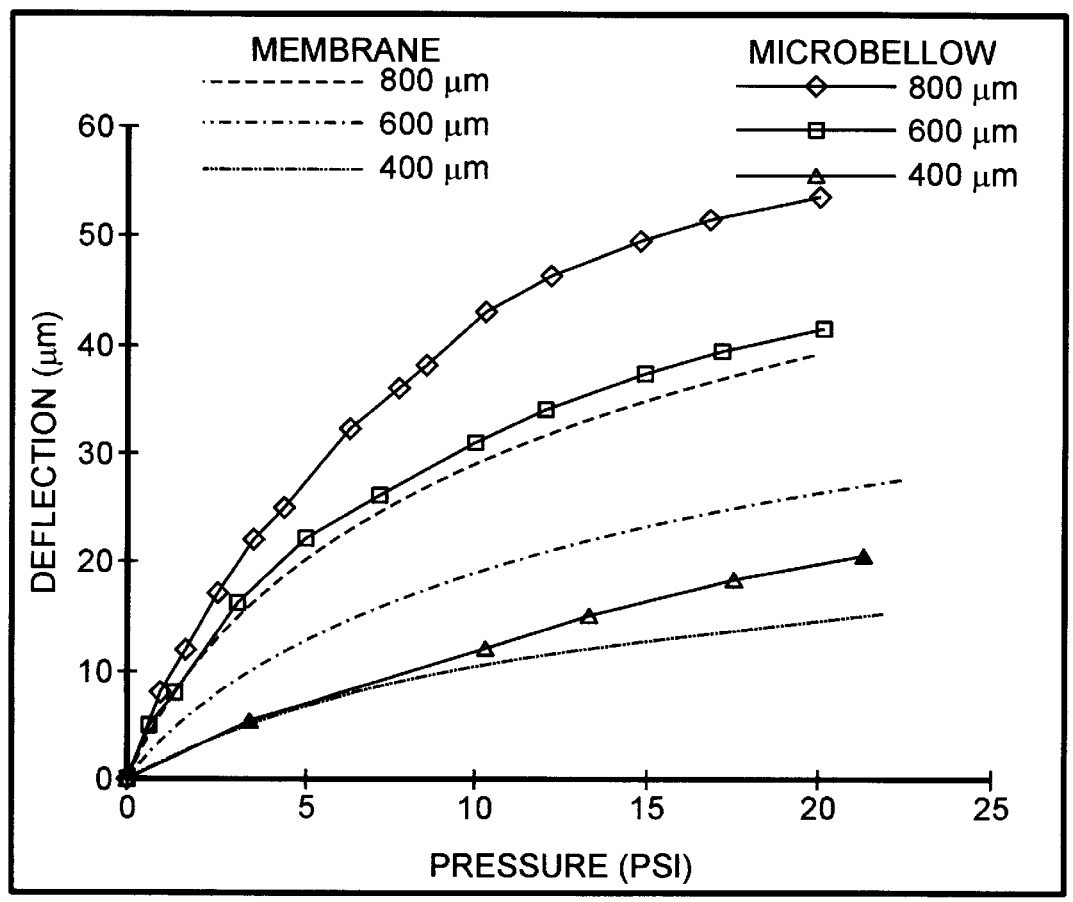
FIG. 6 is a table of burst pressure values for single flat membrane, microbellows membrane with step-up anchors, and microbellows membrane with strengthened anchors.
FIG. 7 shows deflections of microbellows membranes as compared to deflections of flat membranes of comparable size.

FIG. 6 compares the burst pressures of the single flat membrane, the microbellows membrane with step-up anchors, and the microbellows membrane with strengthened anchors. The microbellows membrane structure with strengthened anchors exhibits comparable strengths to that of the flat membranes. The strengthened microbellows membrane bursts at approximately five times higher pressure than the microbellows membrane without strengthened anchors. The inventors believe that the joints strengthened with the polysilicon rims can greatly reduce stress concentration at these joints. Other sacrificial layer materials can also be used to strengthen the joints.

Pneumatic Load-deflection Experiments of Microbellows Membranes

Load-deflection tests are performed on three-layer microbellows actuators. The microbellows actuators are actuated pneumatically by applying pressure from the back side window 160 of the microbellows actuator 100. The corresponding deflections can be measured under an optical microscope 580 with a calibrated focus adjustment.

The apparatus used to measure burst pressure as shown in FIG. 5 can be adapted to measure load-deflections by incorporating an optical microscope 580. The microbellows actuator 100 is mounted and sealed on a chip holder 510 and is placed on the x-y stage 585 of an optical microscope 580 with z-direction focus adjustment calibrated in 1 $\mu$m increments.

Compressed nitrogen in gas cylinder 520 can be used as the pressure source. Other gases can also be used. The pressure level is controlled by the pressure regulator 540 and monitored by the pressure gauge 570, e.g. Omega HHP 4100 available from Omega. By adjusting the input pressure and focus position, the center deflection of the microbellows membrane is measured with ±1 $\mu$m resolution.

FIG. 7 shows the center deflection distances of microbellows membrane with diameters of 400 $\mu$m, 600 $\mu$m and 800 $\mu$m under various pressure loads. With about 20 PSI pressure input, the 400 $\mu$m microbellows membrane deflects about 20 $\mu$m, the 600 $\mu$m microbellows membrane deflects about 41 $\mu$m and the 800 $\mu$m microbellows membrane deflects about 53 $\mu$m.

FIG. 7 also shows plots for three times at the deflection of the circular flat membranes with the same dimensions as the three-layer microbellows membranes. These values were plotted in order to compare the deflection distances of the flat membrane with the deflection distances of the three-layer microbellows membrane. These projected deflection values of the circular flat membranes are calculated by the following equation:

$$P = C_1 t \sigma a^{-2} d + [C_2 f(v) t a^{-4}][E(1-v)^{-1} d^3]$$

where, P is the applied pressure; d is the center deflection; E is the Young's modulus of silicon nitride, assume 300 GPa; $\sigma$ is the residual stress in silicon nitride layer, assume 100 MPa; v is the Poisson's ratio of silicon nitride, assume 0.25; a is the radius of the membrane; t is the thickness of the membrane.

For circular membranes, $C_1 = 4.0$; $C_2 = 2.67$; $f(v) = (1.026 + 0.233 v)^{-1}$.

As shown in FIG. 7, the three-layer microbellows membrane can deliver more than three times the deflection of a flat membrane with the same dimensions. The multi-layer microbellows membrane has structural advantages over the single layer membrane. The multi-layer microbellows membrane provides more surface area available for deflection during actuation while occupying comparable area on the MEMS device.

Additionally, these gains are augmented by the release of residual stress in the multiple layers of the microbellows membrane and the improvement of boundary conditions at the joints between the individual layers of the microbellows membrane. These results show that the strengthened anchor structure can greatly improve the strength of the microbellows membrane without occupying additional chip real estate and without adversely affecting the microbellows membrane's deflection performance. These load-deflection performance results confirm that the multi-layer microbellows membrane can achieve large deflections while having small dimensions.

Thermopneumatic Microbellows Actuators

Figure 8:
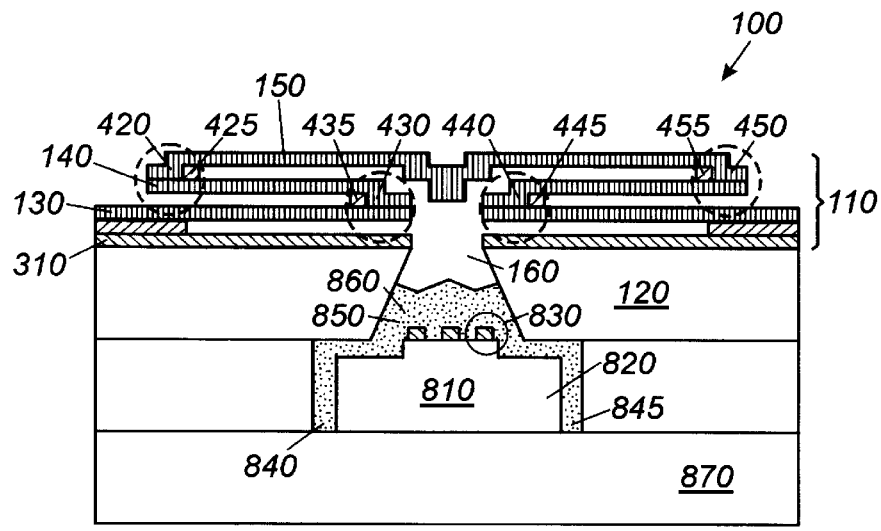
FIG. 8 shows a cross-section of a thermopneumatic microbellows actuator.

Microbellows membrane structures can be used to build thermopneumatic actuators as shown in FIG. 8. Thermopneumatic actuation is chosen to demonstrate the effectiveness of the micromachined microbellows actuator because thermopneumatic actuation can generate large forces, e.g. several Newtons, thereby resulting in the maximum deflection allowed by the actuator membrane.

A thermopneumatic actuator uses heated liquid/gas to produce a force for actuating a membrane. A thermopneumatic actuator can include a resistive heater 810. The resistive heater 810 is fabricated by evaporating and patterning a layer of 50 angstrom Cr/5000 angstrom Au on a heater support substrate 820 to form a 2 Ω resistor 830. One possible support substrate is made of PYREX™. Another embodiment features a layer of 5 nm Cr/200 nm Au on PYREX™ glass to form a 40 Ω resistor. The resistive heater 810 is used to heat the liquid/gas in the system.

Two holes for liquid/gas filling 840, 845 are drilled into the heater support substrate 820. The heater chip 810 is glued to the back window 160 of the microbellows actuator 100 with epoxy. After the epoxy cures, the cavity 850 is filled with a liquid/gas 860 and sealed with a backing plate 870, preferably made of PYREX™.

PYREX™ glass can be used because of the material's lower thermal conductivity when compared with regular glass. PYREX™ has a thermal conductivity of 0.1 W/m° C. while regular glass has a thermal conductivity of 1.0 W/m° C.

Figure 9:
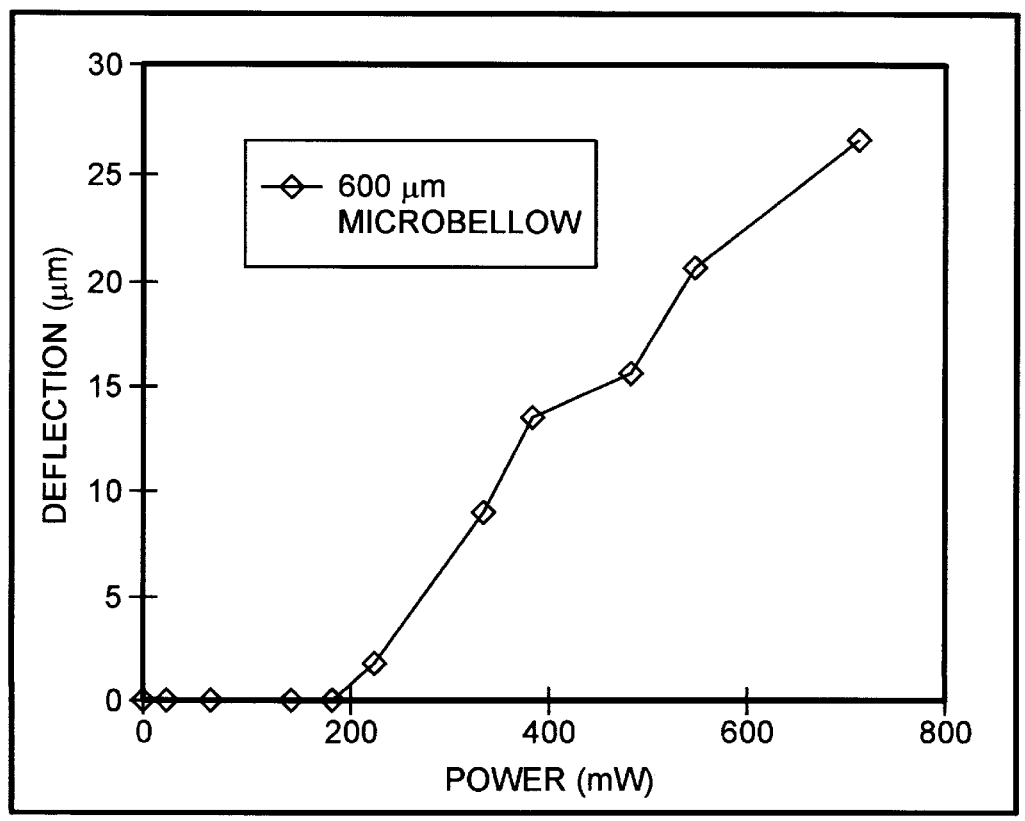
FIG. 9 shows deflection distance as a function of power input in a thermopneumatic microbellows actuator.

Actuation is initiated by applying power to the heater 810. The deflection of the microbellows actuator 100 is measured from rest position using the calibrated microscope focusing method. The thermopneumatic actuation test results of a 600 μm microbellows membrane are shown in FIG. 9. The microbellows membrane 110 deflects about 27 μm with approximately 720 mW power input. Such power levels are used because some of the heat conducts away through the heater support substrate 820 and the surrounding silicon.

An alternative embodiment is to minimize the size of the heater support substrate 820 in the heater chip 810. Since heat conducts away from the heat resistors 830 into the heater support substrate 820, reducing the size of the heater support substrate 820 can increase efficiency of the heater chip 810. Rather than using a solid block of support material for mounting the resistors, a thin layer of support material having holes is used.

Figure 10A:
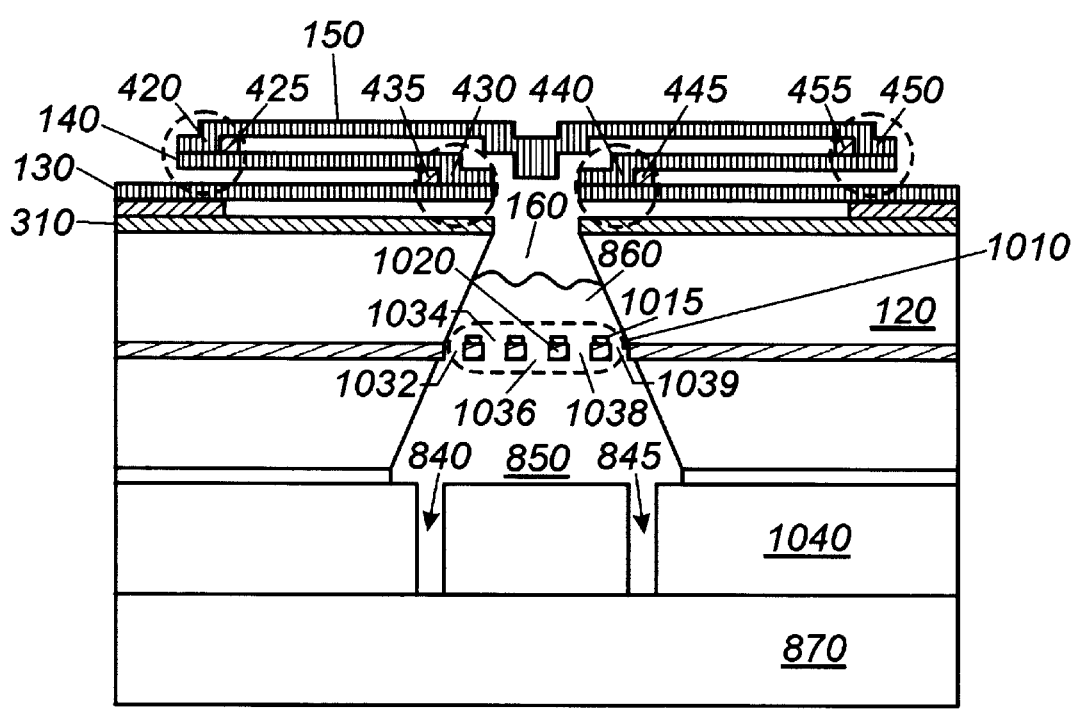
FIG. 10A shows a cross-section of an alternative embodiment of a thermopneumatic microbellows actuator having a suspended resistive heater chip.

FIG. 10A shows a cross-section of a thermopneumatic actuator having a suspended resistive heater chip 1010. Two holes for liquid/gas filling 840, 845 are drilled into a backing support 1040. The backing support 1040 can be made from silicon or glass. A backing plate 870 seals the cavity 850. During operation, the liquid/gas 860 occupying cavity 850 surrounds the resistive heater chip 1010. Resistors 1015 are suspended on a thin heater support substrate 1020 having holes 1032, 1034, 1036, 1038, 1039. FIG. 10B shows a top view of the suspended resistive heater chip 1010.

Because of the small cross-section of the thin heater support substrate 1020, the heat lost to the heater support substrate and environment is reduced. Silicon nitride is one preferred material for the heater support substrate 1020 because silicon nitride has low thermal conductivity. Other low thermal conducting materials can also be used.

FIGS. 11A–11C show major fabrication steps for the suspended resistive heater chip 1010. KOH etching is used to form a silicon frame 1110. FIG. 11A shows forming a layer of heater support substrate 1120, e.g. silicon nitride, on the silicon frame 1110. A layer of about 100 angstrom Cr/500 angstrom Au is evaporated and pattered to define the resistors 1015 as shown in FIG. 11B. In FIG. 11C, an array of holes 1032, 1034, 1036, 1038, 1039, of about 200 μm in diameter, is etched in the heater support substrate layer 1120. These holes can be etched in silicon nitride by using $SF_6/O_2$ plasma. These holes function to equalize the pressure across the suspended resistive heater chip 1010 during actuator operation.

Various working liquids can be used in the thermopneumatic actuator. Some of these include: deionized water, isopropanol, and FLUORINERT™ PF-5060, PF-5070. Fully filled liquid cavities are desirable to minimize bubble formation on the heater chip.

Although only a few embodiments have been described in detail above, those having ordinary skill in the art will certainly understand that many modifications are possible in the preferred embodiment without departing from the teachings thereof.

Alternative materials and etching methods may be used to form the structures of the multi-layer microbellows actuator. The inventors disclosed one specific embodiment featuring a three layer microbellows membrane. Additional layers can easily be incorporated to fabricate the multi-layer microbellows membrane.

Some novel structures disclosed by the inventors include the multi-layer bellows-style membrane, the strengthened anchor joints of the multi-layer bellows-style membrane, and the suspended resistive heaters of the thermopneumatic actuator apparatus. Alternative materials and methods may be used to form these structures. These structures may be implemented in a variety of MEMS devices and are not limited to microvalves and micropumps.

All such modifications are intended to be encompassed within the following claims.

What is claimed is:

1. A method of fabricating a microbellows actuator membrane, comprising:

obtaining a support substrate;

growing a support substrate protectant layer on said support substrate;

first depositing a first sacrificial layer on top of said support substrate protectant layer;

second depositing a first structural layer on top of said first sacrificial layer;

third depositing a second sacrificial layer on top of said first structural layer;

patterning said second sacrificial layer to open a contact window between said first structural layer and a second structural layer;

fourth depositing said second structural layer on top of said second sacrificial layer;

patterning said second structural layer;

fifth depositing a third sacrificial layer on top of said second structural layer;

patterning said third sacrificial layer;

sixth depositing a third structural layer on top of said third sacrificial layer;

patterning said third structural layer;

etching a back side of said support substrate and a portion of said support substrate protectant layer forming an opening;

immersing said support substrate with said first, second, third sacrificial layers and said first, second, third structural layers in an etchant;

removing said first, second, third sacrificial layer thereby releasing the microbellows actuator membrane.

2. A method as in claim 1, wherein said support substrate is made of silicon.

3. A method as in claim 1, wherein said support substrate protectant is made of thermal oxide.

4. A method as in claim 1, wherein said support substrate protectant layer is 0.5 µm thick.

5. A method as in claim 1, wherein said first sacrificial layer is LPCVD undoped polysilicon.

6. A method as in claim 1, wherein said first depositing is done at above 600 degrees Celsius.

7. A method as in claim 1, wherein said second sacrificial layer is LPCVD undoped polysilicon.

8. A method as in claim 1, wherein said third depositing is done at above 600 degrees Celsius.

9. A method as in claim 1, wherein said third sacrificial layer is LPCVD undoped polysilicon.

10. A method as in claim 1, wherein said fifth depositing is done at above 600 degrees Celsius.

11. A method as in claim 1, wherein said first structural layer is LPCVD silicon nitride.

12. A method as in claim 1, wherein said second depositing is done at approximately 835 degrees Celsius.

13. A method as in claim 1, wherein said second depositing is at a 4:1 dichlorosilane (DCS):$NH_3$ flow ratio.

14. A method as in claim 1, wherein said second structural layer is LPCVD silicon nitride.

15. A method as in claim 1, wherein said fourth depositing is done at approximately 835 degrees Celsius.

16. A method as in claim 1, wherein said fourth depositing is at a 4:1 dichlorosilane (DCS):$NH_3$ flow ratio.

17. A method as in claim 1, wherein said third structural layer is LPCVD silicon nitride.

18. A method as in claim 1, wherein said sixth depositing is done at approximately 835 degrees Celsius.

19. A method as in claim 1, wherein said sixth depositing is at a 4:1 dichlorosilane (DCS):$NH_3$ flow ratio.

20. A method as in claim 1, wherein said etching is done with KOH.

21. A method as in claim 1, wherein said immersing is done in TMAH solution.

22. A method as in claim 1, wherein said immersing is done at around 90 degrees Celsius.

23. A method as in claim 1, further comprising forming anchor structures at points where one structural layer contacts another structural layer.

24. A method as in claim 23, wherein said anchor structures are strengthened by forming an additional block portion adjacent to said anchor structures.

25. A method as in claim 24, wherein said additional block portion is made of polysilicon.

26. A method as in claim 24, wherein said additional block portion is made of polysilicon doped with boron.

27. A method as in claim 24, wherein said additional block portion is a polysilicon block containing $4 \times 10^2$ boron atoms/$cm^3$.

28. A method as in claim 1, wherein said first structural layer is made of Parylene.

29. A method as in claim 1, wherein said second structural layer is made of Parylene.

30. A method as in claim 1, wherein said third structural layer is made of Parylene.

31. A method as in claim 1, further comprising forming additional structural layers on top of said third structural layer.

32. A method as in claim 1, wherein said additional structural layers are made of Parylene.

33. A method as in claim 1, wherein said additional structural layers are made of silicon nitride.

34. A method as in claim 1, wherein said first, second, third structural layers are deposited at a certain dichlorosilane:$NH_3$ ratio sufficient to reduce tensile stress and minimize cracking of said structural layers.

35. A method as in claim 1, wherein said additional structural layers are deposited at a certain dichlorosilane:$NH_3$ ratio sufficient to reduce tensile stress and minimize cracking of said structural layers.

* * * * *